United States Patent
Dwarakanath et al.

(10) Patent No.: US 7,710,093 B2
(45) Date of Patent: *May 4, 2010

(54) DRIVER FOR A POWER CONVERTER AND A METHOD OF DRIVING A SWITCH THEREOF

(75) Inventors: Mirmira Ramarao Dwarakanath, Somerset, NJ (US); Harry Thomas Weston, Union, NJ (US)

(73) Assignee: Enpirion, Inc., Hampton, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/961,224

(22) Filed: Dec. 20, 2007

(65) Prior Publication Data

US 2008/0106246 A1 May 8, 2008

Related U.S. Application Data

(63) Continuation of application No. 10/767,540, filed on Jan. 29, 2004, now Pat. No. 7,330,017.

(51) Int. Cl.
*G05F 1/59* (2006.01)
(52) U.S. Cl. .......................... 323/282; 326/83; 327/333
(58) Field of Classification Search ................. 323/316, 323/315, 313, 314, 282; 327/333, 109; 326/63, 326/68, 80–83
See application file for complete search history.

(56) References Cited

U.S. PATENT DOCUMENTS

| 4,654,770 | A | 3/1987 | Santurtûn et al. |
|---|---|---|---|
| 4,761,725 | A | 8/1988 | Henze |
| 4,801,816 | A | 1/1989 | Merlo et al. |
| 4,912,622 | A | 3/1990 | Steigerwald et al. |
| 4,982,353 | A | 1/1991 | Jacob et al. |
| 5,245,228 | A | 9/1993 | Harter |
| 5,258,662 | A | 11/1993 | Skovmand |
| 5,285,369 | A | 2/1994 | Balakrishnan |
| 5,371,415 | A | 12/1994 | Dixon et al. |
| 5,414,341 | A | 5/1995 | Brown |
| 5,469,334 | A | 11/1995 | Balakrishnan |

(Continued)

OTHER PUBLICATIONS

Zhou, X., et al., "Improved Light-Load Efficiency for Synchronous Rectifier Voltage Regulation Module," IEEE Transactions on Power Electronics, Sep. 2000, pp. 826-834, vol. 15, No. 5, IEEE, Los Alamitos, CA.

(Continued)

*Primary Examiner*—Harry Behm
(74) *Attorney, Agent, or Firm*—Slater & Matsil, L.L.P.

(57) ABSTRACT

A driver for a power converter, method of driving a switch thereof, and a power converter employing the same. In one embodiment, the driver includes switching circuitry referenced to a voltage level and configured to provide a drive signal for a switch referenced to another voltage level and subject to a control voltage limit. In a related, but alternative embodiment, the driver is employable with a power converter couplable to a source of electrical power adapted to provide an input voltage thereto. The power converter includes a power train having a switch referenced to the input voltage and subject to a control voltage limit. The driver includes switching circuitry referenced to a voltage level different from the input voltage and configured to provide a drive signal for the switch within the control voltage limit of the switch.

20 Claims, 3 Drawing Sheets

U.S. PATENT DOCUMENTS

| | | | |
|---|---|---|---|
| 5,510,739 A | 4/1996 | Caravella et al. | |
| 5,541,541 A | 7/1996 | Salamina et al. | |
| 5,568,044 A | 10/1996 | Bittner | |
| 5,594,324 A | 1/1997 | Canter et al. | |
| 5,625,312 A | 4/1997 | Kawakami et al. | |
| 5,689,213 A | 11/1997 | Sher | |
| 5,796,276 A | 8/1998 | Phillips et al. | |
| 5,864,225 A | 1/1999 | Bryson | |
| 5,877,611 A | 3/1999 | Brkovic | |
| 5,977,811 A | 11/1999 | Magazzú | |
| 6,005,377 A | 12/1999 | Chen et al. | |
| 6,118,351 A | 9/2000 | Kossives et al. | |
| 6,169,433 B1 | 1/2001 | Farrenkopf | |
| 6,201,429 B1 | 3/2001 | Rosenthal | |
| 6,211,706 B1 * | 4/2001 | Choi et al. | 327/108 |
| 6,222,403 B1 | 4/2001 | Mitsuda | |
| 6,255,714 B1 | 7/2001 | Kossives et al. | |
| 6,262,564 B1 | 7/2001 | Kanamori | |
| 6,285,209 B1 | 9/2001 | Sawai | |
| 6,285,539 B1 | 9/2001 | Kashimoto et al. | |
| 6,320,449 B1 | 11/2001 | Capici et al. | |
| 6,388,468 B1 | 5/2002 | Li | |
| 6,407,579 B1 | 6/2002 | Goswick | |
| 6,407,594 B1 | 6/2002 | Milazzo et al. | |
| 6,477,065 B2 | 11/2002 | Parks | |
| 6,495,019 B1 | 12/2002 | Filas et al. | |
| 6,541,819 B2 | 4/2003 | Lotfi et al. | |
| 6,570,413 B1 | 5/2003 | Kumagai et al. | |
| 6,573,694 B2 | 6/2003 | Pulkin et al. | |
| 6,580,258 B2 | 6/2003 | Wilcox et al. | |
| 6,639,427 B2 | 10/2003 | Dray et al. | |
| 6,650,169 B2 | 11/2003 | Faye et al. | |
| 6,791,305 B2 | 9/2004 | Imai et al. | |
| 6,822,882 B1 | 11/2004 | Jacobs et al. | |
| 6,828,825 B2 * | 12/2004 | Johnson et al. | 326/68 |
| 6,879,137 B2 | 4/2005 | Sase et al. | |
| 6,922,044 B2 * | 7/2005 | Walters et al. | 323/288 |
| 7,015,544 B2 | 3/2006 | Lotfi et al. | |
| 7,019,505 B2 | 3/2006 | Dwarakanath et al. | |
| 7,038,438 B2 | 5/2006 | Dwarakanath et al. | |
| 7,038,514 B2 | 5/2006 | Leith et al. | |
| 7,061,217 B2 | 6/2006 | Bayer et al. | |
| 7,214,985 B2 | 5/2007 | Lotfi et al. | |
| 7,230,302 B2 | 6/2007 | Lotfi et al. | |
| 7,521,907 B2 | 4/2009 | Cervera et al. | |
| 2002/0175661 A1 | 11/2002 | Wheeler et al. | |
| 2004/0169498 A1 | 9/2004 | Goder et al. | |
| 2005/0046405 A1 | 3/2005 | Trafton et al. | |
| 2005/0167756 A1 | 8/2005 | Lotfi et al. | |
| 2005/0168205 A1 | 8/2005 | Dwarakanath et al. | |
| 2005/0169024 A1 | 8/2005 | Dwarakanath et al. | |
| 2006/0038225 A1 | 2/2006 | Lotfi et al. | |
| 2006/0132217 A1 | 6/2006 | Lou et al. | |
| 2007/0210777 A1 | 9/2007 | Cervera et al. | |
| 2008/0018366 A1 | 1/2008 | Hanna | |
| 2008/0094114 A1 | 4/2008 | Dwarakanath et al. | |
| 2009/0167267 A1 | 7/2009 | Dwarakanath et al. | |

OTHER PUBLICATIONS

Barrado, A., et al., "New DC/DC Converter with Low Output Voltage and Fast Transient Response," Proceedings of the IEEE Applied Power Electronics Conference, 2003, pp. 432-437, IEEE, Los Alamitos, CA.

Betancourt-Zamora, R.J. et al., "A 1.5 mW, 200 MHz CMOS VCO for Wireless Biotelemetry," First International Workshop on Design of Mixed-Mode Integrated Circuits and Applications, Jul. 1997, pp. 72-74, Cancun, Mexico.

Goder, D., et al., "V2 Architecture Provides Ultra-Fast Transient Response in Switch Mode Power Supplies," Proceedings of HFPC Power Conversion, 1996, pp. 414-420.

Goodman, J. et al., "An Energy/Security Scalable Encryption Processor Using an Embedded Variable Voltage DC/DC Converter," IEEE Journal of Solid-State Circuits, Nov. 1998, vol. 33, No. 11, IEEE, Los Alamitos, CA.

Horowitz, P., et al., "The Art of Electronics," Second Edition, 1989, pp. 288-291, Cambridge University Press, Cambridge, MA.

"Linear Technology: LTC3736-1: Dual 2-Phase, No RSENSETM, Synchronous Controller with Spread Spectrum," 2004, 28 pp., Linear Technology Corporation, Milpitas, CA.

Lotfi, A.W., et al., "Issues and Advances in High-Frequency Magnetics for Switching Power Supplies," Proceedings of the IEEE, Jun. 2001, vol. 89, No. 6, pp. 833-845, IEEE, Los Alamitos, CA.

Patella, B.J., et al., "High-Frequency Digital Controller IC for DC/DC Converters," IEEE Proceedings of the Applied Power Electronics Conference, Mar. 10, 2002, 7 pp., IEEE, Los Alamitos, CA.

Peterchev, A.V., et al., "Quantization Resolution and Limit Cycling in Digitally Controlled PWM Converters," IEEE Transactions on Power Electronics, Jan. 2003, pp. 301-303, vol. 18, No. 1, IEEE, Los Alamitos, CA.

Redl, R., et al., "Optimizing the Load Transient Response of the Buck Converter," Proceedings of the IEEE Applied Power Electronics Conference, 1998, pp. 170-176, IEEE, Los Alamitos, CA.

Schoneman, G.K., et al., "Output Impedance Considerations for Switching Regulators with Current-Injected Control," Proceedings of the 18th Annual IEEE Power Electronics Specialists Conference, Jun. 1987, pp. 324-335, IEEE, Los Alamitos, CA.

Soto, A., et al. "Analysis of the Buck Converter for Scaling the Supply Voltage of Digital Circuits," Proceedings of the IEEE Applied Power Electronics Conference, 2003, pp. 711-717, IEEE, Los Alamitos, CA.

Soto, A., et al., "Design Methodology for Dynamic Voltage Scaling in the Buck Converter," Proceedings of the IEEE Applied Power Electronics Conference, 2005, pp. 263-269, IEEE, Los Alamitos, CA.

"TPS40100: Midrange Input Synchronous Buck Controller with Advanced Sequencing and Output Margining," May 2005, 37 pp., Texas Instruments Incorporated, Dallas, TX.

* cited by examiner

DRIVER FOR A POWER CONVERTER AND A METHOD OF DRIVING A SWITCH THEREOF

This application is a continuation of patent application Ser. No. 10/767,540, entitled "Driver for a Power Converter and a Method of Driving a Switch Thereof," filed on Jan. 29, 2004, now U.S. Pat. No. 7,330,017, issued Feb. 12, 2008, which application is incorporated herein by reference.

TECHNICAL FIELD

The present invention is directed, in general, to power electronics and, more specifically, to a driver for a power converter, method of driving a switch thereof, and a power converter employing the same.

BACKGROUND

A switch mode power converter (also referred to as a "power converter") is a power supply or power processing circuit that converts an input voltage waveform into a specified output voltage waveform. Controllers associated with the power converters manage an operation thereof by controlling the conduction periods of switches employed therein. Generally, the controllers are coupled between an input and output of the power converter in a feedback loop configuration (also referred to as a "control loop" or "closed control loop").

Typically, the controller measures an output characteristic (e.g., an output voltage) of the power converter and based thereon modifies a duty cycle of the switches of the power converter. The duty cycle is a ratio represented by a conduction period of a switch to a switching period thereof. Thus, if a switch conducts for half of the switching period, the duty cycle for the switch would be 0.5 (or 50 percent). Additionally, as the needs for systems such as a microprocessor powered by the power converter dynamically change (e.g., as a computational load on the microprocessor changes), the controller should be configured to dynamically increase or decrease the duty cycle of the switches therein to maintain the output characteristic at a desired value.

In combination with the controller, a driver is often employed to provide a drive signal to the switches of the power converter as a function of a signal from the controller. Assuming that the switches of the power converter are metal oxide semiconductor field effect transistors ("MOSFETs"), the driver is referred to as a gate driver and provides a gate drive signal to a gate terminal (i.e., a control terminal) of the MOSFET to control an operation thereof. Providing a gate drive signal with a limited control voltage range (or "gate voltage limit") for a MOSFET is of particular interest in the design and implementation of power converters. In an exemplary application, the power converters have the capability to convert an unregulated input voltage such as five volts to a lower, regulated, output voltage such as 2.5 volts to power a load.

As discussed above, the power converters are frequently employed to power loads having tight regulation characteristics such as a microprocessor with, for instance, five volts provided from a source of electrical power (e.g., a voltage source). To provide the voltage conversion and regulation functions, the power converters include active switches such as the MOSFETs that are coupled to the voltage source and periodically switch a reactive circuit element such as an inductor to the voltage source at a switching frequency that may be on the order of five megahertz. To maintain high power conversion efficiency and low cost, the MOSFETs employed for the switches in the power converters are generally configured with fine line structures and thin gate oxides. The aforementioned structures that form the MOSFETs, however, present new design challenges associated with the control signals such as a gate voltage adapted to control the conduction periods of the switches.

For instance, recently designed MOSFETs for the power converters can reliably sustain control signals of about 2.5 volts from the gate terminal to the source terminal, whereas MOSFETs of earlier designs were able to sustain control signals of 20 volts or more. Additionally, the power converters often employ a P-channel MOSFET as a main switch therein. Inasmuch as the P-channel MOSFET is generally coupled to the input voltage (e.g., nominal five volts) of the power converter, the gate voltage is desirably controlled to a value of the input voltage (again, five volts) to transition the switch to a non-conducting state. Conversely, the P-channel MOSFET is enabled to conduct at a gate voltage equal to the input voltage of five volts minus 2.5 volts, which represents about the maximum sustainable voltage from the gate terminal to the source terminal of the switch (also referred to as a "gate-to-source voltage limit" or the "gate voltage limit" of the switch).

It is relatively common to employ a driver for a P-channel MOSFET that includes a series-coupled, totem-pole arrangement of a P-channel and N-channel MOSFET with coupled gate terminals. In the environment of a power converter, the totem pole driver (as the driver is customarily designated) for the P-channel MOSFET is coupled to the source of electrical power for the power converter and the controller of the power converter. The drive signal is generated from a junction coupling the drain terminals of the P-channel and N-channel MOSFETs of the totem pole driver. When a signal from the controller to the totem pole driver is high, the drive signal is essentially grounded. When the signal from the controller to the totem pole driver is low, the drive signal is substantially equal to the input voltage of the power converter. In effect, the drive signal from the totem pole driver exhibits voltages over the entire voltage range of the source of electrical power for the power converter. Alternatively, the driver may be described as providing a drive signal referenced to ground when its output is low, and a drive signal referenced to the input voltage when its output is high.

When providing a drive signal to a P-channel MOSFET (or any switch for that matter) having a gate voltage limit of 2.5 volts, and in the environment of a power converter having a nominal input voltage of five volts, the extended voltage range present on the gate terminal of the switch may break down the integrity of the thin gate oxide of the switch. In other words, when the input voltage to the power converter which is translated into the drive signal to the switch under certain conditions as described above exceeds the gate voltage limit thereof, the switch may be damaged and fail. Thus, the totem pole driver and other presently available drivers are typically not practical for applications wherein the switch to be driven exhibits a smaller gate voltage limit from the gate terminal to the source terminal thereof.

Another level of complexity arises when the switch to be driven and the driver are referenced to different voltages. In the environment of the power converter described above, circuitry that embodies the driver may be coupled to ground and referenced to a ground potential and the switch to be driven may be referenced to, for instance, the input voltage of the power converter. As a result, the driver is referenced to a ground potential and the switch is referenced to an input voltage such as an unregulated five volt input voltage. Thus, in conjunction with the control voltage limit, the driver should be adapted to drive a switch referenced to another voltage level as described above and adaptively perform the necessary voltage translation to the another voltage level to provide the drive signal.

Accordingly, what is needed in the art is a driver for the power converters, and a method of driving a switch thereof, that takes into account a control voltage limit associated with a switch (i.e., the gate voltage limit for a MOSFET) of the power converter referenced to a voltage level different from the driver that overcomes the deficiencies in the prior art.

SUMMARY OF THE INVENTION

These and other problems are generally solved or circumvented, and technical advantages are generally achieved, by advantageous embodiments of the present invention which includes a driver having switching circuitry referenced to a voltage level and configured to provide a drive signal for a switch referenced to another voltage level and subject to a control voltage limit. In a related, but alternative embodiment, the driver is employable with a power converter couplable to a source of electrical power adapted to provide an input voltage thereto. The power converter includes a power train having a switch referenced to the input voltage and subject to a control voltage limit. The driver includes switching circuitry referenced to a voltage level different from the input voltage and configured to provide a drive signal for the switch within the control voltage limit of the switch. For instance, the switch may be a metal oxide semiconductor field effect transistor ("MOSFET") having a gate terminal and a source terminal referenced to the input voltage of the power converter. The switching circuitry is therein configured to provide a gate drive signal for the MOSFET within a gate voltage limit thereof.

In another aspect and for use with a power converter couplable to a source of electrical power adapted to provide an input voltage thereto, the present invention provides a method of driving a switch of the power converter referenced to the input voltage and subject to a control voltage limit. The method includes providing a drive signal for the switch within the control voltage limit of the switch with switching circuitry referenced from a voltage level different from the input voltage. In this and other aspects of the present invention, the switching circuitry may include a plurality of driver switches couplable to ground wherein ones of the plurality of driver switches are couplable to the ground, the source of electrical power and a bias voltage source for providing a bias voltage. In accordance therewith, ones of the plurality of driver switches are configured to cooperate to provide the drive signal referenced to the input voltage and within the control voltage limit of the switch. Additionally, the switching circuitry may include at least one driver switch configured to enable a mode of operation wherein the drive signal for the switch is referenced to the voltage level of the switching circuitry.

In yet another aspect, the present invention provides a power converter couplable to a source of electrical power adapted to provide an input voltage thereto. The power converter includes a power train including a switch, referenced to the input voltage and subject to a control voltage limit, configured to conduct for a duty cycle and provide a regulated output characteristic at an output of the power converter. The power converter also includes a controller configured to provide a signal to control the duty cycle of the switch. The power converter still further includes a driver including switching circuitry referenced to a voltage level different from the input voltage and configured to provide a drive signal for the switch within the control voltage limit as a function of the signal from the controller. Additionally, the controller is configured to provide a complement of the signal to control the duty cycle of the switch. In accordance therewith, the driver is configured to provide the drive signal for the switch within the control voltage limit as a function of the complement of the signal from the controller.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a driver for a power converter, method of driving a switch thereof and a power converter employing the same. The principles of the present invention, however, may also be applied to all types of power supplies employing various conversion topologies that may benefit from a driver that takes into account a control voltage limit associated with a switch [e.g., the gate voltage limit for a metal oxide semiconductor field effect transistor ("MOSFET")] of the power converter referenced to a voltage level different from the driver.

Figure 1:
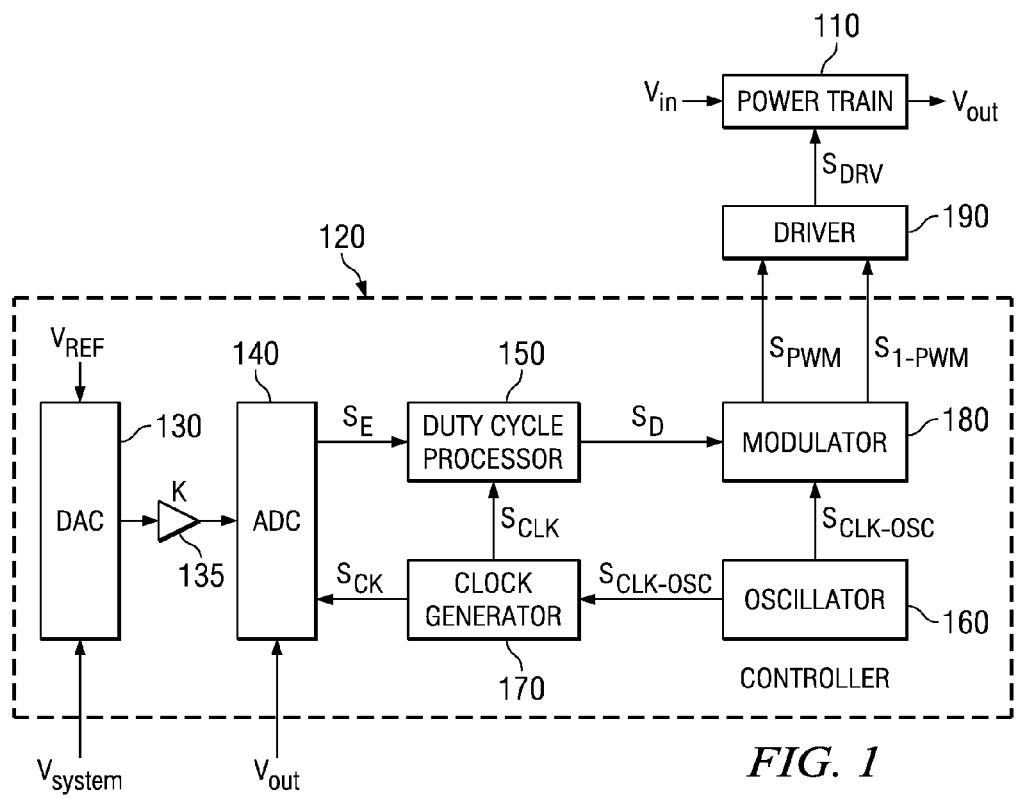
FIG. 1 illustrates a block diagram of an embodiment of a power converter constructed according to the principles of the present invention.

Referring initially to FIG. 1, illustrated is a block diagram of an embodiment of a power converter constructed according to the principles of the present invention. The power converter includes a power train 110, a controller 120 and a driver 190, and provides power to a system such as a microprocessor. The power train 110 may employ a buck converter topology as illustrated and described with respect to FIG. 2 below. Of course, any number of converter topologies may benefit from the use of a driver 190 constructed according to the principles of the present invention and are well within the broad scope of the present invention.

The power train 110 receives an input voltage $V_{in}$ at an input thereof as a power source and provides a regulated output characteristic (e.g., an output voltage) $V_{out}$ to power a microprocessor or other load coupled to an output of the power converter. The controller 120 receives a digital word representing a desired characteristic such as a desired system voltage $V_{system}$ from an internal or external source associated with the microprocessor, and the output voltage $V_{out}$ of the power converter. In accordance with the aforementioned characteristics, the controller 120 provides a signal to control a duty cycle and a frequency of at least one switch of the power train 110 to regulate the output voltage $V_{out}$ thereof.

The controller 120 includes a digital-to-analog converter ("DAC") 130 that receives a reference voltage $V_{REF}$ and transforms the desired system voltage $V_{system}$ in the form of a digital word or format into an analog equivalent (i.e., an analog format). The reference voltage $V_{REF}$ provides a reference for a calibration of the digital-to-analog conversion process associated with the DAC 130. The analog format of the desired system voltage $V_{system}$ is then amplified with a gain K, if necessary, by an operational amplifier 135. A sparse analog-to-digital converter ("ADC") 140 of the controller 120 employs the analog format of the desired system voltage $V_{system}$ and the output voltage $V_{out}$ to provide an error signal $S_E$ to a duty cycle processor 150. The error signal $S_E$ typically is in the form of a series of binary error signals and represents a difference between the output voltage $V_{out}$ of the power converter and the desired system voltage $V_{system}$ in discrete steps. In an advantageous embodiment, a magnitude of the discrete steps of the error signal $S_E$ is small when the difference is small and a magnitude of the discrete steps of the error signal $S_E$ is larger when the difference is larger.

Thus, the sparse ADC 140 determines a difference between the output voltage $V_{out}$ and the desired system voltage $V_{system}$ and provides the error signal $S_E$ therefrom. The duty cycle processor 150 then employs the error signal $S_E$ to provide a digital duty cycle signal $S_D$ (e.g., a four or an eight bit digital signal representing a duty cycle) to control a duty cycle of at least one switch of the power converter. An embodiment of a sparse ADC 140 and duty cycle processor 150 are disclosed in U.S. Patent Publication No. 2005/0169024, entitled "Controller for a Power Converter and a Method of Controlling a Switch Thereof," to Dwarakanath, et al., now U.S. Pat. No. 7,038,438, issued May 2, 2006, which is incorporated herein by reference.

The duty cycle processor 150 is coupled to a modulator 180 [e.g., a pulse width modulator ("PWM")] that converts the digital duty cycle signal $S_D$ from the duty cycle processor 150 into a signal so that the driver 190 (e.g., a gate driver) can control at least one switch of the power converter. An operation of the duty cycle processor 150 is gated by a clock signal $S_{CLK}$ provided by a clock generator 170. The clock generator 170 also provides another clock signal $S_{CK}$ for the sparse ADC 140, which may be shifted in phase as compared to the clock signal $S_{CLK}$ for the duty cycle processor 150. A frequency of the clock signals $S_{CLK}$, $S_{CK}$ may be on the order of one thirty-second or one eighth of the switching frequency of the power converter.

The switching frequency of the modulator 180 is typically the same as the switching frequency of the power converter and is controlled by an oscillator (e.g., a ring oscillator) 160. The ring oscillator 160 also provides a high frequency clock signal $S_{CLK-OSC}$ to the clock generator 170, which is divided down to produce the clock signals $S_{CLK}$, $S_{CK}$. In accordance with the aforementioned characteristics, a drive signal(s) (e.g., a gate drive signal) $S_{DRV}$ is provided by the driver 190 to control a duty cycle and a frequency of at least one switch of the power converter to regulate the output voltage $V_{out}$ thereof.

There are a number of design choices available for the modulator 180. For instance, a digital counter may be clocked by the ring oscillator 160. The modulator 180 reads the digital duty cycle signal $S_D$ from the duty cycle processor 150 and generates a high signal during a portion of the counting cycle that corresponds to a period when a switch of the power converter is being controlled to conduct, and a low signal otherwise. At the end of the counting cycle, the counter resets to zero. The ring oscillator 160 generates a clock signal $S_{CLK-OSC}$ that can facilitate fine duty cycle granularity or resolution by the modulator 180 thereby allowing accurate control, as necessary, of the output voltage $V_{out}$ of the power converter.

Thus, the modulator 180 supplies a signal that is typically constructed to form a pulse width modulated signal $S_{PWM}$ to control the duty cycle for at least one switch of the power converter. The modulator 180 can also supply a complement of the signal to control the duty cycle for at least one switch of the power converter (e.g., a complementary pulse width modulated signal $S_{1-PWM}$). The pulse width modulated signal $S_{PWM}$ and the complementary pulse width modulated signal $S_{1-PWM}$ are then fed to the driver 190. Additionally, an embodiment of a modulator is disclosed in U.S. Patent Publication No. 2005/0168205, entitled "Controller for a Power Converter and Method of Controlling a Switch Thereof," to Dwarakanath, et al., now U.S. Pat. No. 7,019,505, issued Mar. 28, 2006, which is incorporated herein by reference.

The driver 190 then provides the drive signal $S_{DRV}$ to control at least one switch of the power converter to regulate the output voltage $V_{out}$ thereof. As will become more apparent, the driver 190 is particularly adapted to take into account a control voltage limit associated with a switch of the power converter. Moreover, the driver 190 resolves a challenge wherein circuitry of the driver is referenced to a voltage level and the switch of the power converter to be driven is referenced to another voltage level. Additionally, the driver 190 may employ techniques to provide sufficient signal delays to prevent crosscurrents when controlling multiple switches in the power converter. While a particular type of controller 120 has been described in the environment of the power converter, those skilled in the art should understand that other controllers (including principally analog controllers) adapted to control at least one switch of the power converter are well within the broad scope of the present invention.

Figure 2:
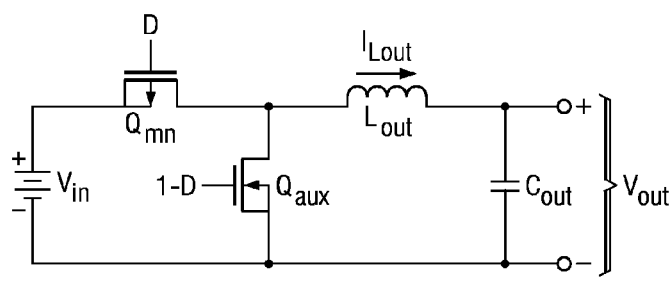
FIG. 2 illustrates a schematic diagram of an embodiment of a power train of a power converter constructed according to the principles of the present invention.

Turning now to FIG. 2, illustrated is a schematic diagram of an embodiment of a power train of a power converter constructed according to the principles of the present invention. While in the illustrated embodiment, the power train employs a buck converter topology, those skilled in the art should understand that other converter topologies such as a forward converter topology are well within the broad scope of the present invention.

The power train of the power converter receives an input voltage $V_{in}$ (e.g., an unregulated input voltage) from a source of electrical power (represented by a battery) at an input thereof and provides a regulated output voltage $V_{out}$ to power, for instance, a microprocessor at an output of the power converter. In keeping with the principles of a buck converter topology, the output voltage $V_{out}$ is generally less than the input voltage $V_{in}$ such that a switching operation of the power converter can regulate the output voltage $V_{out}$. A main switch $Q_{mn}$ (e.g., a P-channel MOSFET) is enabled to conduct for a primary interval (generally co-existent with a primary duty cycle "D" of the main switch $Q_{mn}$) and couples the input voltage $V_{in}$ to an output filter inductor $L_{out}$. During the primary interval, an inductor current $I_{Lout}$ flowing through the output filter inductor $L_{out}$ increases as a current flows from the input to the output of the power train. An AC component of the inductor current $I_{Lout}$ is filtered by the output capacitor $C_{out}$.

During a complementary interval (generally co-existent with a complementary duty cycle "1-D" of the main switch $Q_{mn}$), the main switch $Q_{mn}$ is transitioned to a non-conducting state and an auxiliary switch $Q_{aux}$ (e.g., a N-channel MOSFET) is enabled to conduct. The auxiliary switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary switches $Q_{mn}$, $Q_{aux}$ may be adjusted to maintain a regulation of the output voltage $V_{out}$ of the power converter. Those skilled in the art should understand, however, that the conduction periods for the main and auxiliary switches $Q_{mn}$, $Q_{aux}$ may be separated by a small time interval to avoid cross conduction therebetween and beneficially to reduce the switching losses associated with the power converter.

As described above, the main and auxiliary switches $Q_{mn}$, $Q_{aux}$, in the illustrated embodiment, are embodied in P-channel and N-channel MOSFETs, respectively. Due to the design of the main switch $Q_{mn}$ and operating conditions of the power converter, a driver employable to provide a drive signal to control the main switch $Q_{mn}$ is subject to design challenges that a driver according to the present invention is adapted to overcome. Prior to introducing a driver according to the present invention, a conventional driver and the limitations associated therewith is hereinafter described.

Figure 3:
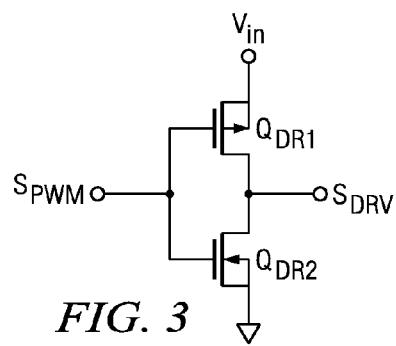
FIG. 3 illustrates a schematic diagram of a conventional totem pole driver.

Turning now to FIG. 3, illustrated is a schematic diagram of a conventional totem pole driver. As mentioned above, the totem pole driver typically includes first and second driver switches $Q_{DR1}$, $Q_{DR2}$ embodied in a P-channel MOSFET and a N-channel MOSFET, respectively, with coupled gate terminals. In the environment of a power converter, the first driver switch $Q_{DR1}$ is coupled to the source of electrical power for the power converter and the controller of the power converter. A drive signal $S_{DRV}$ is generated from a junction coupling the drain terminals of the first and second driver switches $Q_{DR1}$, $Q_{DR2}$ of the totem pole driver. When a signal (e.g., a pulse width modulated signal $S_{PWM}$) from the controller to the totem pole driver is high, the drive signal $S_{DRV}$ is essentially grounded. When the signal $S_{PWM}$ from the controller to the totem pole driver is low, the drive signal $S_{DRV}$ is substantially equal to the input voltage $V_{in}$ (e.g., an unregulated input voltage) of the power converter. In effect, the drive signal $S_{DRV}$ from the totem pole driver exhibits voltages over the entire voltage range of the source of electrical power for the power converter.

When providing a drive signal to a switch such as a P-channel MOSFET having a control voltage limit (i.e., a gate voltage limit) of 2.5 volts, and in the environment of a power converter having a nominal input voltage $V_{in}$ of five volts, the extended voltage range present on the gate terminal of the switch may break down the integrity of the thin gate oxide of the switch. In other words, when the input voltage $V_{in}$ to the power converter which is translated into the drive signal $S_{DRV}$ to the switch under certain conditions as described above exceeds the gate voltage limit thereof, the switch may be damaged and fail. Another layer of complexity arises when the first and second driver switches $Q_{DR1}$, $Q_{DR2}$ are referenced to a voltage level (e.g., a ground potential) and the switch to be driven is referenced to another voltage (e.g., the input voltage $V_{in}$ to the power converter). Colloquially, the switch of the power converter is referred to as a "floating" switch. Thus, the totem pole driver and other presently available drivers are typically not practical for applications wherein the switch to be driven exhibits a smaller control voltage limit (e.g., gate voltage limit) from the control terminal to another terminal (e.g., the gate terminal to the source terminal) thereof and is referenced to a voltage level different from the driver.

Figure 4:
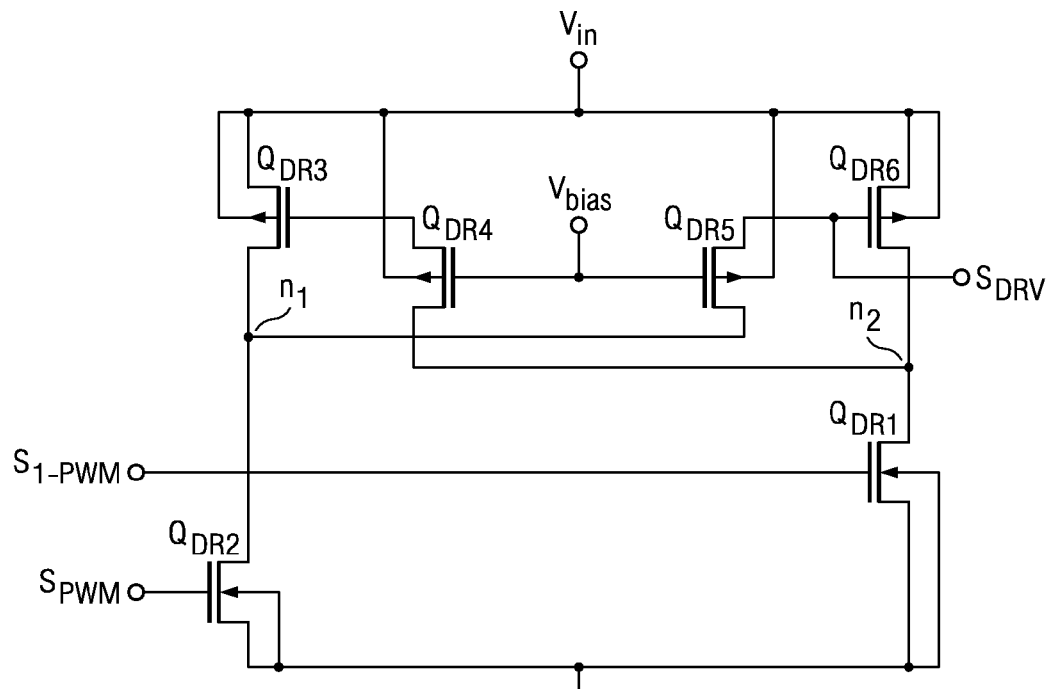
FIG. 4 illustrates a schematic diagram of an embodiment of a driver constructed according to the principles of the present invention.

Turning now to FIG. 4, illustrated is a schematic diagram of an embodiment of a driver constructed according to the principles of the present invention. The driver is adapted to provide a drive signal $S_{DRV}$ to control a switch having a control voltage limit. More specifically and in the illustrated embodiment, the driver is a gate driver that provides a gate drive signal $S_{DRV}$ to, for instance, a P-channel MOSFET that exhibits a gate voltage limit (i.e., a gate-to-source voltage limit) of 2.5 volts. The gate driver receives a signal (e.g., a pulse width modulated signal $S_{PWM}$) from a controller (see, for instance, the controller 120 illustrated and described with respect to FIG. 1) and a complement of the signal (e.g., a complementary pulse width modulated signal $S_{1-PWM}$) from the controller.

The gate driver includes switching circuitry formed by a plurality of driver switches such as first, second, third, fourth, fifth and sixth driver switches $Q_{DR1}$, $Q_{DR2}$, $Q_{DR3}$, $Q_{DR4}$, $Q_{DR5}$, $Q_{DR6}$ coupled to a source of electrical power for the power converter and the controller of the power converter. The gate driver is also coupled to a bias voltage source that provides a bias voltage $V_{bias}$, which may be internally or externally generated and may depend on an input voltage of the power converter. For purposes of the discussion herein, it is assumed that the first, second, third, fourth, fifth and sixth driver switches $Q_{DR1}$, $Q_{DR2}$, $Q_{DR3}$, $Q_{DR4}$, $Q_{DR5}$, $Q_{DR6}$ have a low gate voltage limit and a higher voltage drain. Thus, the first, second, third, fourth, fifth and sixth driver switches $Q_{DR1}$, $Q_{DR2}$, $Q_{DR3}$, $Q_{DR4}$, $Q_{DR5}$, $Q_{DR6}$ may exhibit a low gate voltage limit (e.g. 2.5 volts) and at the same time handle drain-to-source voltages above the gate voltage limit thereof (e.g., ten volts).

To simplify the discussion, it is also assumed that the first, second, third, fourth, fifth and sixth driver switches $Q_{DR1}$, $Q_{DR2}$, $Q_{DR3}$, $Q_{DR4}$, $Q_{DR5}$, $Q_{DR6}$ exhibit a gate threshold voltage of about is 0.5 volts, which is consistent with a number of fine feature size, low voltage MOSFET designs. The gate threshold voltage provides a voltage level above or below which (depending on the type) the first, second, third, fourth, fifth and sixth driver switches $Q_{DR1}$, $Q_{DR2}$, $Q_{DR3}$, $Q_{DR4}$, $Q_{DR5}$, $Q_{DR6}$ are enabled to conduct.

In the illustrated embodiment, the first and second driver switches $Q_{DR1}$, $Q_{DR2}$ are N-channel MOSFETs and the third, fourth, fifth and sixth driver switches $Q_{DR3}$, $Q_{DR4}$, $Q_{DR5}$, $Q_{DR6}$ are P-channel MOSFETs. The drain terminals of the second, third and fifth driver switches $Q_{DR2}$, $Q_{DR3}$, $Q_{DR5}$ are coupled together at a first node $n_1$. The drain terminals of the first, fourth and sixth driver switches $Q_{DR1}$, $Q_{DR4}$, $Q_{DR6}$ are coupled together at a second node $n_2$. While each of the first, second, third, fourth, fifth and sixth driver switches $Q_{DR1}$, $Q_{DR2}$, $Q_{DR3}$, $Q_{DR4}$, $Q_{DR5}$, $Q_{DR6}$ are illustrated with gate, source and drain terminals, it is also common for each of the first, second, third, fourth, fifth and sixth driver switches $Q_{DR1}$, $Q_{DR2}$, $Q_{DR3}$, $Q_{DR4}$, $Q_{DR5}$, $Q_{DR6}$ to include a body terminal.

The gate driver is coupled between an input voltage $V_{in}$ (e.g., an unregulated input voltage at a nominal five volts) of the power converter and ground, with a potential difference therebetween for the purposes of this discussion of five volts. The source terminal of the third and sixth driver switches $Q_{DR3}$, $Q_{DR6}$ are coupled to the input voltage $V_{in}$. The bias voltage $V_{bias}$, assumed for this discussion to be 2.5 volts with respect to the ground, is coupled to the gate terminal of the fourth and fifth driver switches $Q_{DR4}$, $Q_{DR5}$, and a return connection of the bias voltage source is coupled to the ground. The bias voltage source may or may not be derived from the source of electrical power that provides the input voltage $V_{in}$, depending on the application for the gate driver.

When the pulse width modulated signal $S_{PWM}$ provided to the second driver switch $Q_{DR2}$ is high (i.e., when the pulse width modulated signal $S_{PWM}$ is more positive than the gate threshold voltage of 0.5 volts), the first node $n_1$ that couples the drain terminals of the second and third driver switches $Q_{DR2}$, $Q_{DR3}$ is pulled low by the second driver switch $Q_{DR2}$. The drain terminal of the fifth driver switch $Q_{DR5}$ is also coupled to the first node $n_1$ and the gate terminal thereof is coupled to the bias voltage source. Thus, the source of the fifth driver switch $Q_{DR5}$ is pulled down to three volts (i.e., one gate threshold voltage value more positive than the bias voltage $V_{bias}$). The gate drive signal $S_{DRV}$ is therefore pulled down two volts below the input voltage $V_{in}$, which is a sufficient voltage to enable a switch such as the main switch $Q_{mn}$, a P-channel MOSFET, illustrated and described with respect to the power train of the power converter of FIG. 2 to conduct.

When the complementary pulse width modulated signal $S_{1-PWM}$ provided to the first driver switch $Q_{DR1}$ is more positive than the gate threshold voltage, the first driver switch $Q_{DR1}$ is enabled to conduct and the second node $n_2$ is pulled down to substantially the ground voltage by an on-resistance of the first driver switch $Q_{DR1}$. The gate of the third driver switch $Q_{DR3}$ is pulled down to about three volts (i.e., one gate threshold voltage value more positive than the bias voltage $V_{bias}$). Thus, the third driver switch $Q_{DR3}$ is enabled to conduct and the drain thereof, coupled to first node $n_1$, is pulled up substantially to the input voltage $V_{in}$. The fifth driver switch $Q_{DR5}$ is now enabled to conduct because the gate voltage is more than one gate threshold voltage more negative than the drain thereof, and the source of the fifth driver switch $Q_{DR5}$ is pulled up substantially to the input voltage $V_{in}$. Therefore, the gate drive signal $S_{DRV}$ from the gate driver is also pulled up to substantially the input voltage $V_{in}$, which is a sufficient voltage to transition a switch such as the main switch $Q_{mn}$, a P-channel MOSFET, illustrated and described with respect to the power train of the power converter of FIG. 2 to a non-conducting state.

Accordingly, a type of level shifting gate driver has been introduced with an improved level-shifting capability that can controllably raise the gate voltage of an exemplary switch (e.g., a P-channel MOSFET) to substantially the input voltage to transition the switch to a non-conducting state, and controllably reduce the gate voltage to a lower voltage to enable the switch to conduct. Inasmuch as the gate terminal of the fifth driver switch $Q_{DR5}$ is coupled to the bias voltage source $V_{bias}$, the fifth driver switch $Q_{DR5}$ is transitioned to a non-conducting state when a voltage present on its source is less than the bias voltage $V_{bias}$ plus its gate threshold voltage (treating the gate threshold voltage of a P-channel MOSFET as a positive number). If the gate driver properly applies the bias voltage $V_{bias}$ (e.g., if the bias voltage $V_{bias}$ is the input voltage $V_{in}$ minus 2.5 volts and adjusted for the gate threshold voltage of the fifth driver switch $Q_{DR5}$), the gate drive signal $S_{DRV}$ will not decrease more than 2.5 volts below input voltage $V_{in}$ thereby not exceeding the gate voltage limit of the switch to be driven. The bias voltage $V_{bias}$, therefore, is preferably dependent on the input voltage $V_{in}$. The gate terminal of the switch (again, a P-channel MOSFET) coupled to the gate driver will thus be protected by the gate driver and, in particular, by the fifth driver switch $Q_{DR5}$, which operatively provides a protective voltage limiting function. Finally, the gate driver is symmetrical and as the pulse width modulated signal $S_{PWM}$ and complementary pulse width modulated signal $S_{1-PWM}$ alternate, the conduction states and voltages within the gate driver alternate accordingly.

Figure 5:
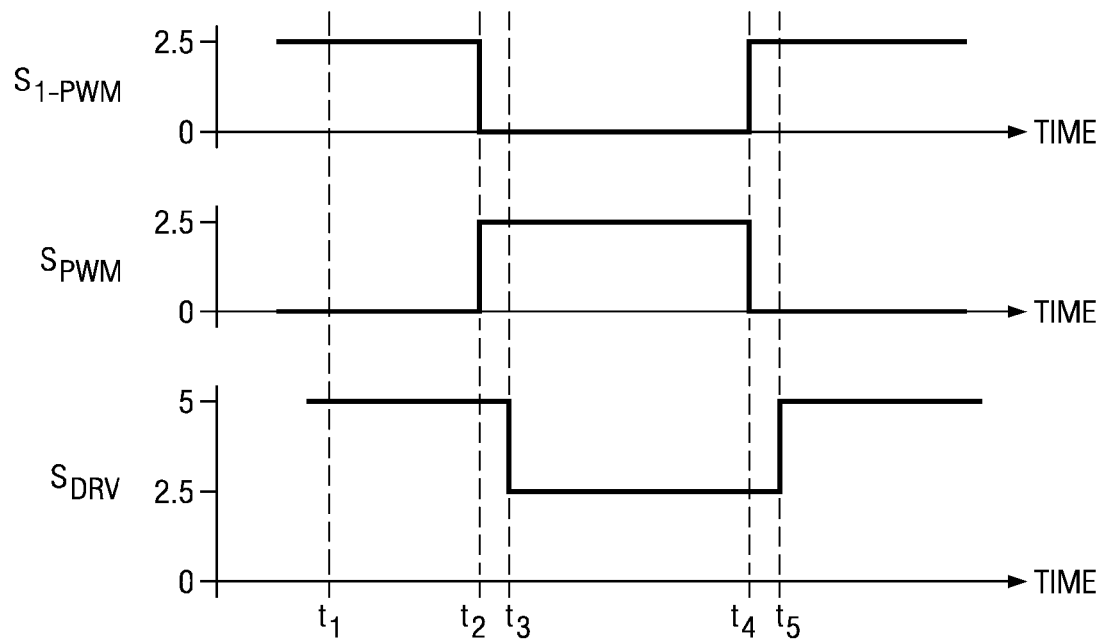
FIG. 5 illustrates waveform diagrams demonstrating an exemplary operation of the driver of FIG. 4.

Turning now to FIG. 5, illustrated are waveform diagrams demonstrating an exemplary operation of the gate driver of FIG. 4. At a time $t_1$, the complementary pulse width modulated signal $S_{1-PWM}$ is at a voltage of 2.5 volts thereby enabling the first driver switch $Q_{DR1}$ to conduct. Conversely, the pulse width modulated signal $S_{PWM}$ is at zero volts at the time $t_1$, which transitions the second driver switch $Q_{DR2}$ to a non-conducting state. The gate drive signal $S_{DRV}$ from the gate driver is maintained at five volts thereby causing the switch such as the main switch $Q_{mn}$, a P-channel MOSFET as described above, to transition to a non-conducting state.

At a time $t_2$, a polarity of the pulse width modulated signal $S_{PWM}$ and the complementary pulse width modulated signal $S_{1-PWM}$ alternate thereby causing the second driver switch $Q_{DR2}$ to transition to a conducting state and causing the first driver switch $Q_{DR1}$ to transition to a non-conducting state. A short time later at a time $t_3$, the gate drive signal $S_{DRV}$ drops from five volts to 2.5 volts thereby enabling the main switch $Q_{mn}$, a P-channel MOSFET as described above with a 2.5 volt gate voltage limit, to conduct. The brief delay period between time $t_2$ and time $t_3$ represents an intrinsic delay associated with the switching action of the gate driver and may be on the order of a nanosecond. Thereafter, at a time $t_4$, the polarity of the pulse width modulated signal $S_{PWM}$ and the complementary pulse width modulated signal $S_{1-PWM}$ alternate. Then, at a time $t_5$, the gate drive signal $S_{DRV}$ correspondingly changes with the brief delay between the time $t_4$ and the time $t_5$, which again is expected to be on the order of a nanosecond.

The plurality of driver switches of the switching circuitry of the gate driver referenced to a voltage level (in this case, ground potential) cooperate to provide the gate drive signal $S_{DRV}$ to a switch (e.g., the main switch $Q_{mn}$, a P-channel MOSFET, of the power converter) referenced to another voltage level (in this case, the input voltage $V_{in}$ of the power converter). Thus, in addition to providing a gate drive signal $S_{DRV}$ within the gate voltage limit of the switch, the gate driver also performs a voltage translation between the gate driver referenced to a voltage level and the switch referenced to another voltage level.

Figure 6:
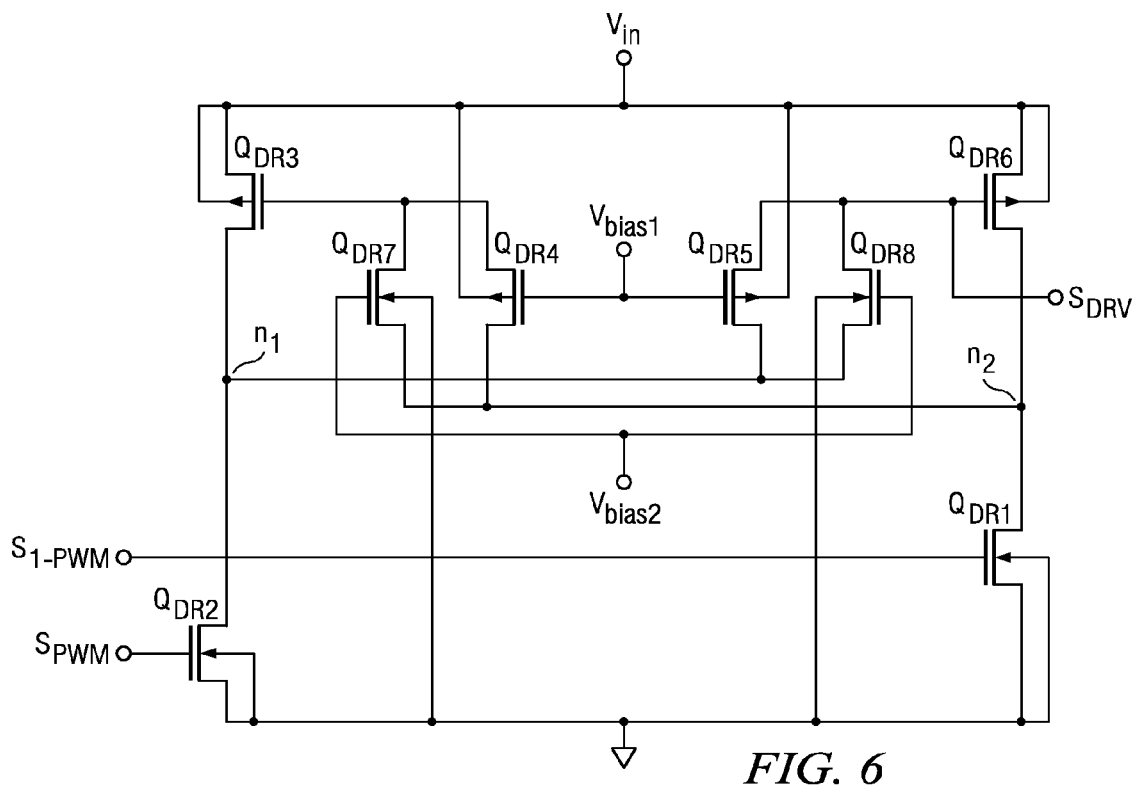
FIG. 6 illustrates a schematic diagram of another embodiment of a driver constructed according to the principles of the present invention.

Turning now to FIG. 6, illustrated is a schematic diagram of another embodiment of a driver constructed according to the principles of the present invention. The driver is adapted to provide a drive signal $S_{DRV}$ to control a switch having a control voltage limit. More specifically and in the illustrated embodiment, the driver is a gate driver that provides a gate drive signal $S_{DRV}$ to, for instance, a P-channel MOSFET that exhibits a gate voltage limit (i.e., a gate-to-source voltage limit) of 2.5 volts. The gate driver receives a signal (e.g., a pulse width modulated signal $S_{PWM}$) from a controller (see, for instance, the controller 120 illustrated and described with respect to FIG. 1) and a complement of the signal (e.g., a complementary pulse width modulated signal $S_{1-PWM}$) from the controller.

The gate driver includes switching circuitry formed by a plurality of driver switches such as first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ coupled to a source of electrical power for the power converter and the controller of the power converter. The gate driver is also coupled to a first bias voltage source that provides a first bias voltage $V_{bias1}$, which may be internally or externally generated and may depend on an input voltage of the power converter. For purposes of the discussion herein, it is assumed that the first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ have a low gate voltage limit and a higher voltage drain. Thus, the first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ may exhibit a low gate voltage limit (e.g. 2.5 volts) and at the same time handle drain-to-source voltages above the gate voltage limit thereof (e.g., ten volts).

To simplify the discussion, it is also assumed that the first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ exhibit a gate threshold voltage of about is 0.5 volts, which is consistent with a number of fine feature size, low voltage MOSFET designs. The gate threshold voltage provides a voltage level above or below which (depending on the type) the first, second, third, fourth, fifth, sixth and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ are enabled to conduct.

In the illustrated embodiment, the first, second, seventh and eighth driver switches $Q_{DR1}$, $Q_{DR2}$, $Q_{DR7}$, $Q_{DR8}$ are N-channel MOSFETs and the third, fourth, fifth and sixth driver switches $Q_{DR3}$, $Q_{DR4}$, $Q_{DR5}$, $Q_{DR6}$ are P-channel MOSFETs. The drain terminals of the second, third and fifth driver switches $Q_{DR2}$, $Q_{DR3}$, $Q_{DR5}$ are coupled together at a first node $n_1$. The drain terminals of the first, fourth and sixth driver switches $Q_{DR1}$, $Q_{DR4}$, $Q_{DR6}$ are coupled together at a second node $n_2$. While each of the first, second, seventh and eighth driver switches $Q_{DR1}$, $Q_{DR2}$, $Q_{DR7}$, $Q_{DR8}$ are illustrated with gate, source and drain terminals, it is also common for each of the first, second, seventh and eighth driver switches $Q_{DR1}$, $Q_{DR2}$, $Q_{DR7}$, $Q_{DR8}$ to include a body terminal.

The gate driver is coupled between an input voltage $V_{in}$ (e.g., an unregulated input voltage at a nominal five volts) of the power converter and ground, with a potential difference therebetween for the purposes of this discussion of five volts. The source terminal of the third and sixth driver switches $Q_{DR3}$, $Q_{DR6}$ are coupled to the input voltage $V_{in}$. The first bias voltage $V_{bias1}$, assumed for this discussion to be 2.5 volts with respect to the ground, is coupled to the gate terminal of the fourth and fifth driver switches $Q_{DR4}$, $Q_{DR5}$, and a return connection of the first bias voltage source is coupled to the ground. The first bias voltage source may or may not be derived from the source of electrical power that provides the input voltage $V_{in}$, depending on the application for the gate driver.

As illustrated, the seventh and eighth driver switches $Q_{DR7}$, $Q_{DR8}$ are parallel coupled to the fourth and fifth driver switches $Q_{DR4}$, $Q_{DR5}$, respectively. The seventh and eighth driver switches $Q_{DR7}$, $Q_{DR8}$ include a higher voltage source and a higher voltage drain and typically exhibit a higher source-to-gate voltage handling (e.g., five volts) when the source is more positive than the gate and at the same time handle drain-to-source voltages above the low gate voltage limit thereof. The gate terminal of the seventh and eighth driver switches $Q_{DR7}$, $Q_{DR8}$ are coupled together and to a second voltage bias source that provides a second bias voltage $V_{bias2}$, which may be internally or externally generated and may depend on an input voltage of the power converter.

The gate driver, in the illustrated embodiment, can operate in a couple of different modes of operation. For instance, when the input voltage $V_{in}$ to the power converter is greater than an upper gate voltage limit for a main switch $Q_{mn}$ such as a P-channel MOSFET (see, as an example, the power train of the power converter illustrated and described with respect to FIG. 2) driven by the gate driver, then voltage protective features of the gate driver are enabled (see the description above with respect to the gate driver illustrated in FIG. 4). In this mode of operation, the second bias voltage $V_{bias2}$ provided to the gate terminals of the seventh and eighth driver switches $Q_{DR7}$, $Q_{DR8}$ is at a ground potential. Since the source terminals of the seventh and eighth driver switches $Q_{DR7}$, $Q_{DR8}$ are not coupled to a potential at or below the ground potential, the seventh and eighth driver switches $Q_{DR7}$, $Q_{DR8}$ are not enabled to conduct as a consequence of the grounded gate terminals thereof. Thus, under the aforementioned circumstances, the seventh and eighth driver switches $Q_{DR7}$, $Q_{DR8}$ have little effect on the operation of the gate driver.

In another operating mode for the gate driver (enabled by the seventh and eighth driver switches $Q_{DR7}$, $Q_{DR8}$), the input voltage $V_{in}$ to the power converter is not greater than an upper gate voltage limit for a main switch $Q_{mn}$ such as a P-channel MOSFET (see, as an example, the power train of the power converter illustrated and described with respect to FIG. 2) driven by the gate driver, then voltage protective features of the gate driver are not necessary. In this mode of operation, the clamping operation of the fifth driver switch $Q_{DR5}$ on the gate drive signal $S_{DRV}$ is inoperative. More specifically, the gate terminal of the seventh and eighth driver switches $Q_{DR7}$, $Q_{DR8}$ are coupled to a suitably high potential such as the input voltage $V_{in}$. As a result, the seventh and eighth driver switches $Q_{DR7}$, $Q_{DR8}$ are enabled to conduct. Thus, the gate drive signal $S_{DRV}$ is coupled to ground potential by an on resistance of the second and eighth driver switches $Q_{DR2}$, $Q_{DR8}$ when the main switch $Q_{mn}$, a P-channel MOSFET as discussed above, driven by the gate driver is enabled to conduct. The gate driver, therefore, selectively provides additional flexibility by altering a voltage applied to an input thereof, consequently accommodating an input voltage $V_{in}$ above or below a gate voltage limit of a switch driven therefrom.

Figure 7:
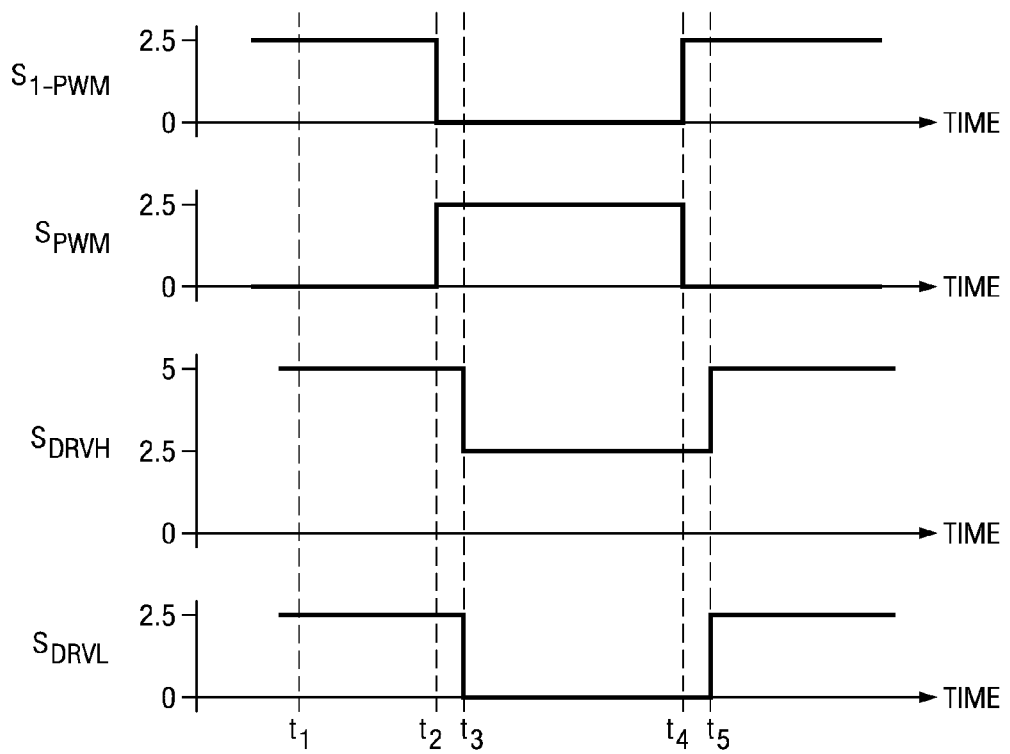
FIG. 7 illustrates waveform diagrams demonstrating an exemplary operation of the driver of FIG. 6.

Turning now to FIG. 7, illustrated are waveform diagrams demonstrating an exemplary operation of the gate driver of FIG. 6. As mentioned above, the gate driver described with respect to FIG. 7 can operate in a couple of different modes of operation. For instance, when the input voltage $V_{in}$ to the power converter is greater than an upper gate voltage limit for a main switch $Q_{mn}$ such as a P-channel MOSFET driven by the gate driver, then voltage protective features of the gate driver are enabled. Inasmuch as the operation under such conditions is analogous to the operation of the gate driver described with respect to FIGS. 4 and 5 above, a detailed description thereof will not be forthcoming. In this mode of operation (see waveforms labeled $S_{PWM}$, $S_{1-PWM}$, $S_{DRVH}$), the gate terminal of the seventh and eighth driver switches $Q_{DR7}$, $Q_{DR8}$ are coupled to the second bias voltage $V_{bias2}$, which is sufficiently near ground potential that the seventh and eighth driver switches $Q_{DR7}$, $Q_{DR8}$ are not enabled to conduct and hence the operating and associated waveforms are analogous to the waveforms of FIG. 5.

In another operating mode for the gate driver, the input voltage $V_{in}$ to the power converter is not greater than an upper gate voltage limit for a main switch $Q_{mn}$ such as a P-channel MOSFET driven by the gate driver, then voltage protective features of the gate driver are not necessary. In this mode of operation (see waveforms labeled $S_{PWM}$, $S_{1-PWM}$, $S_{DRVL}$), the gate terminal of the seventh and eighth driver switches $Q_{DR7}$, $Q_{DR8}$ are coupled to the second bias voltage $V_{bias2}$, which is a suitably high potential such as the input voltage $V_{in}$. The seventh and eighth driver switches $Q_{DR7}$, $Q_{DR8}$ are enabled to conduct, thereby disabling the voltage clamping operation of the fourth and fifth driver switches $Q_{DR4}$, $Q_{DR5}$. When the main switch $Q_{mn}$ driven by the gate driver is enabled to conduct, the gate drive signal $S_{DRVL}$ is substantially zero volts between the time $t_3$ and the time $t_5$. When the main switch $Q_{mn}$ driven by the gate driver is transitioned to a non-conducting state, the gate drive signal $S_{DRVL}$ is held at or below the gate voltage limit of the main switch $Q_{mn}$. The delay between the time $t_2$ and time $t_3$ and the delay between the time $t_4$ and time $t_5$ represents an intrinsic delay associated with the switching action of the gate driver and is again expected to be on the order of a nanosecond.

The plurality of driver switches of the switching circuitry of the gate driver referenced to a voltage level (in this case, ground potential) cooperate to provide the gate drive signal $S_{DRV}$ to a switch (e.g., the main switch $Q_{mn}$, a P-channel MOSFET, of the power converter) referenced to another voltage level (in this case, the input voltage $V_{in}$ of the power converter). Thus, in addition to providing a gate drive signal $S_{DRV}$ within the gate voltage limit of the switch, the gate driver also performs a voltage translation between the gate driver referenced to a voltage level and the switch referenced to another voltage level. Additionally, the seventh and eighth driver switches $Q_{DR7}$, $Q_{DR8}$ are configured to enable a mode of operation wherein the gate drive signal $S_{DRV}$ for the switch is referenced to the voltage level (in this case, the ground potential) of the gate driver.

Thus, a driver and related method of driving at least one switch of a power converter with readily attainable and quantifiable advantages has been introduced. Those skilled in the art should understand that the previously described embodiments of the driver, related method, and power converter employing the same are submitted for illustrative purposes only and that other embodiments capable of producing a drive signal for a switch referenced to different voltage levels and having a control voltage limit are well within the broad scope of the present invention. It is further recognized that multiple switches may be included in a power converter and ones of the switches may be referenced to the same ground potential as the driver (e.g., "freewheeling switches" that can be driven with customary drivers such as the totem pole driver described above). Thus, a driver according to the principles of the present invention and a customary driver may be included in the design of a power converter.

Additionally, in an advantageous embodiment, a power converter constructed accordingly to the principles of the present invention may be embodied in an integrated circuit. Alternatively, portions of the power converter such as the driver and the power train (or portions thereof) may also be embodied in an integrated circuit and still be within the broad scope of the present invention. In accordance therewith, selected switches or other devices of the power converter may be embodied in a semiconductor device as disclosed in U.S. Patent Publication No. 2005/0167756, entitled "Laterally Diffused Metal Oxide Semiconductor Device and Method of Forming the Same," to Lotfi, et al., now U.S. Pat. No. 7,230,302, issued Jun. 12, 2007, which is incorporated herein by reference. The driver includes switching circuitry with a plurality of switches referenced to a different voltage that limit a drive signal to a switch within the control voltage limit thereof. As a result, the power converter can be employed in various applications including conditions wherein the switches are subject to a low gate voltage limit.

Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa. The principles of the present invention may be applied to a wide variety of power converter topologies. While the driver has been described in the environment of a power converter, those skilled in the art should understand that the driver and related principles of the present invention may be applied in other environments or applications such as a power amplifier, motor controller, and a system to control an actuator in accordance with a stepper motor or other electromechanical device.

For a better understanding of digital control theory in power converters see "An Energy/Security Scalable Encryption Processor Using an Embedded Variable Voltage DC/DC Converter," by John Goodman, Abram P. Dancy and Anantha P. Chandrakasan, IEEE Journal of Solid-State Circuits, Vol. 33, No. 11 (November 1998). For a better understanding of power converters, see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). The aforementioned references are incorporated herein by reference in their entirety.

Although the present invention has been described in detail, those skilled in the art should understand that they can make various changes, substitutions and alterations herein without departing from the spirit and scope of the invention in its broadest form.

What is claimed is:

1. A driver comprising switching circuitry referenced to a voltage level and configured to provide a drive signal for a switch referenced to another voltage level and subject to a control voltage limit, said switching circuitry including a first pair of series-coupled driver switches of opposite polarity with a common node therebetween coupled through a clamp driver switch to a second pair of series-coupled driver switches of opposite polarity, wherein said clamp driver switch is configured to limit a voltage to a control terminal of one of said second pair of series-coupled driver switches by a bias voltage applied to a control terminal of said clamp driver switch.

2. The driver as recited in claim 1 wherein said switching circuitry is referenced to a ground potential and said switch is referenced to about five volts.

3. The driver as recited in claim 1 wherein said switch is a metal oxide semiconductor field effect transistor (MOSFET) referenced to said another voltage, said switching circuitry configured to provide a gate drive signal for said switch within a gate voltage limit thereof.

4. The driver as recited in claim 1 wherein said second pair of series-coupled driver switches of opposite polarity are coupled through another clamp driver switch to said first pair of series-coupled driver switches of opposite polarity.

5. The driver as recited in claim 1 wherein said switching circuitry is configured to enable a mode of operation wherein said drive signal for said switch is referenced to said voltage level.

6. For use with a power converter couplable to a source of electrical power adapted to provide an input voltage thereto, said power converter including a power train having a switch referenced to said input voltage and subject to a control voltage limit, a driver, comprising:
  switching circuitry referenced to a voltage level different from said input voltage and configured to provide a drive signal for said switch within said control voltage limit of said switch, said switching circuitry including a first pair of series-coupled driver switches of opposite polarity with a common node therebetween coupled through a clamp driver switch to a second pair of series-coupled driver switches of opposite polarity, wherein said clamp driver switch is configured to limit a voltage to a control terminal of one of said second pair of series-coupled driver switches by a bias voltage applied to a control terminal of said clamp driver switch.

7. The driver as recited in claim 6 wherein said input voltage is about five volts and said switching circuitry is referenced to a ground potential.

8. The driver as recited in claim 6 wherein said switch is a metal oxide semiconductor field effect transistor (MOSFET) referenced to said input voltage, said switching circuitry configured to provide a gate drive signal for said switch within a gate voltage limit thereof.

9. The driver as recited in claim 6 wherein said second pair of series-coupled driver switches of opposite polarity are coupled through another clamp driver switch to said first pair of series-coupled driver switches of opposite polarity.

10. The driver as recited in claim 6 wherein said switching circuitry is configured to enable a mode of operation wherein said drive signal for said switch is referenced to said voltage level.

11. For use with a power converter couplable to a source of electrical power adapted to provide an input voltage thereto, a method of driving a switch of said power converter referenced to said input voltage and subject to a control voltage limit, comprising:
  providing a drive signal for said switch within said control voltage limit of said switch with switching circuitry referenced from a voltage level different from said input voltage, said switching circuitry including a first pair of series-coupled driver switches of opposite polarity with a common node therebetween coupled through a clamp driver switch to a second pair of series-coupled driver switches of opposite polarity, wherein said clamp driver switch is configured to limit a voltage to a control terminal of one of said second pair of series-coupled driver switches by a bias voltage applied to a control terminal of said clamp driver switch.

12. The method as recited in claim 11 wherein said input voltage is about five volts and said switching circuitry is referenced to a ground potential.

13. The method as recited in claim 11 wherein said switch is a metal oxide semiconductor field effect transistor (MOSFET) referenced to said input voltage, said switching circuitry providing a gate drive signal for said switch within a gate voltage limit thereof.

14. The method as recited in claim 11 wherein said second pair of series-coupled driver switches of opposite polarity are coupled through another clamp driver switch to said first pair of series-coupled driver switches of opposite polarity.

15. The method as recited in claim 11 further comprising enabling a mode of operation wherein said drive signal for said switch is referenced to said voltage level.

16. A power converter couplable to a source of electrical power adapted to provide an input voltage thereto, comprising:
  a power train including a switch, referenced to said input voltage and subject to a control voltage limit, configured to conduct for a duty cycle and provide a regulated output characteristic at an output of said power converter;
  a controller configured to provide a signal to control said duty cycle of said switch; and
  a driver including switching circuitry referenced to a voltage level different from said input voltage and configured to provide a drive signal for said switch within said control voltage limit as a function of said signal from said controller, said switching circuitry including a first pair of series-coupled driver switches of opposite polarity with a common node therebetween coupled through a clamp driver switch to a second pair of series-coupled driver switches of opposite polarity, wherein said clamp driver switch is configured to limit a voltage to a control terminal of one of said second pair of series-coupled driver switches by a bias voltage applied to a control terminal of said clamp driver switch.

17. The power converter as recited in claim 16 wherein said controller is configured to provide a complement of said signal to control said duty cycle of said switch, said driver being configured to provide said drive signal for said switch within said control voltage limit as a function of said complement of said signal from said controller.

18. The power converter as recited in claim 16 wherein said switch is a metal oxide semiconductor field effect transistor (MOSFET) referenced to said input voltage, said switching circuitry configured to provide a gate drive signal for said switch within a gate voltage limit thereof.

19. The power converter as recited in claim 16 wherein said second pair of series-coupled driver switches of opposite polarity are coupled through another clamp driver switch to said first pair of series-coupled driver switches of opposite polarity.

20. The power converter as recited in claim 16 wherein said switching circuitry is configured to enable a mode of operation wherein said drive signal for said switch is referenced to said voltage level.

* * * * *